US008314721B2

(12) United States Patent
Xu et al.

(10) Patent No.: US 8,314,721 B2
(45) Date of Patent: Nov. 20, 2012

(54) KEY SWITCH

(75) Inventors: Huan-Ting Xu, Shenzhen (CN); Duo Liu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 859 days.

(21) Appl. No.: 12/432,707

(22) Filed: Apr. 29, 2009

(65) Prior Publication Data

US 2010/0148997 A1 Jun. 17, 2010

(30) Foreign Application Priority Data

Dec. 12, 2008 (CN) .......................... 2008 2 0303351

(51) Int. Cl.
*H03K 17/94* (2006.01)
*H01H 9/00* (2006.01)
*H01C 10/12* (2006.01)

(52) U.S. Cl. ............... 341/22; 200/4; 200/6 R; 200/5 R; 200/314; 200/344; 345/157; 338/99

(58) Field of Classification Search .................... 341/22, 341/34, 27; 200/314, 317, 311, 344, 5 R, 200/1 R, 5 A, 518, 557
See application file for complete search history.

(56) References Cited

U.S. PATENT DOCUMENTS

| | | | | |
|---|---|---|---|---|
| 3,969,595 | A * | 7/1976 | Johnson | 200/5 A |
| 4,771,139 | A * | 9/1988 | DeSmet | 200/5 A |
| 6,271,487 | B1 * | 8/2001 | Domzalski et al. | 200/1 B |
| 6,396,015 | B1 * | 5/2002 | Ko | 200/529 |
| 7,385,530 | B2 * | 6/2008 | Griffin et al. | 341/27 |

* cited by examiner

*Primary Examiner* — Daniel Wu
*Assistant Examiner* — Mancil Littlejohn
(74) *Attorney, Agent, or Firm* — Altis Law Group, Inc.

(57) ABSTRACT

A key switch can generate several signals is provided. The key switch includes a key top, a body, a first electronic circuit, a second electronic circuit, and a switch mechanism. Pressing the key top, the switch key generates a first signal while the first electronic circuit is closed by the switch mechanism; the switch key generates a second signal while the second electronic circuit is closed; and the switch key generates a third signal while both the first electronic circuit and the second electronic circuit is closed.

6 Claims, 6 Drawing Sheets

KEY SWITCH

BACKGROUND

1. Technical Field

The present disclosure relates generally to a switch configuration for a keying operation and, more particularly, to a key-entry switch device (hereinafter referred to as key switch) preferably used for a keyboard incorporated as an input device in electronic equipment.

2. Description of Related Art

User input devices are used with many types of electronic devices to input data and commands. It is well known that a user may have to press more than one key of a keyboard at the same time to input a desired character or command. For example, the "1" key of the keyboard of a desktop computer can be used for both "1" and "!". If the user presses just the one key, the default signal "1" is input. If, however, the user wants to input the "!" character, then the user should press and hold the "shift" key and then press the "1" key.

The above becomes even more inconvenient when adopted by handheld or portable devices such as PDAs, where space is at a premium and it is difficult to selectively press more than one key at a time. Therefore, what is needed is a key switch that can generate several different signals.

BRIEF DESCRIPTION OF THE DRAWINGS

The components of the drawings are not necessarily drawn to scale, the emphasis instead being placed upon clearly illustrating the principles of a key switch. Moreover, in the drawings, like reference numerals designate corresponding parts throughout several views.

DETAILED DESCRIPTION

The embodiments of the present invention are described below in detail, with reference to the accompanying drawings.

Figure 1:
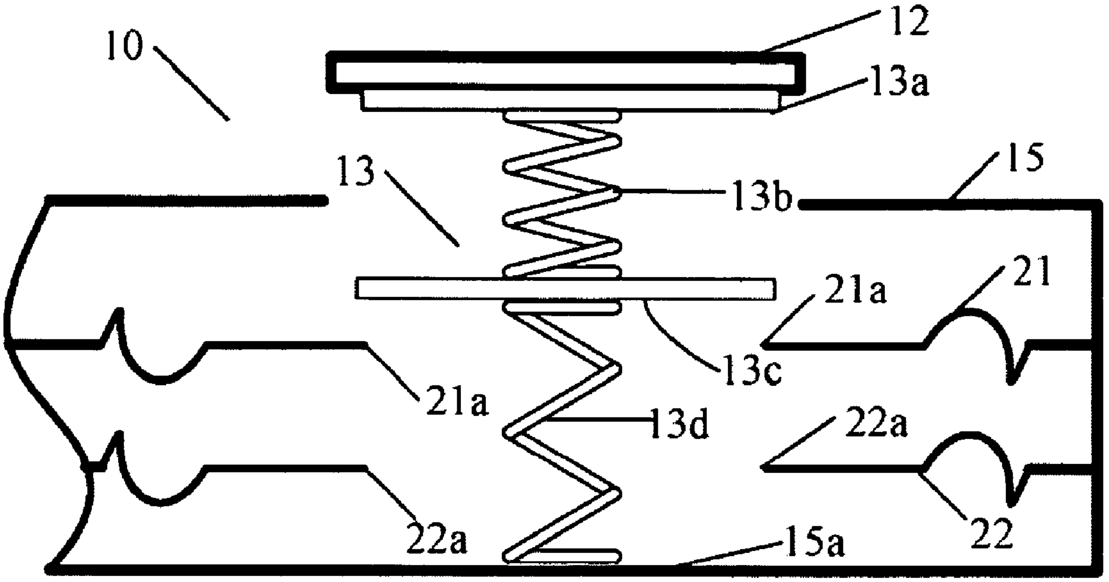
FIG. 1 is a schematic view showing a structure of a key switch in accordance with an exemplary embodiment, the key switch including a key top, a switch mechanism, a body, a first electronic circuit, and a second electronic circuit.

FIG. 1 is a schematic view showing a structure of a key switch in accordance with an exemplary embodiment. The key switch 1 includes at least a key top 12, a switch mechanism 13, a body 15, a first electronic circuit 21, and a second electronic circuit 22. Each of the electronic circuits 21 and 22 has two contact sections. For example, in the embodiment as shown in FIG. 1, the first electronic circuit 21 has two contact sections 21*a*, and the second electronic circuit 22 has two contact sections 22*a*. In this embodiment the key switch can be in any one of four states. A first state when it is not being pressed, a second state where it is partially pressed, a third stated when it is pressed even further, and a fourth state when it is fully pressed. Each state can produce a unique signal according to which circuits are opened and closed at that state. In other embodiments more or less states are possible and will be evident from the explanation of the present embodiment below.

The key top 12, disposed above the switch mechanism 13, is configured to be pressed by a user. The key top 12 can be upwardly and downwardly moved, by being pressed and through the resilient interlocking action of the switch mechanism 13 respectively. In the exemplary embodiment, the key top 12 is made of insulation material, and the key top 12 can be a dish-like component having a generally rectangular shape.

The switch mechanism 13 is configured for selectively contacting the contact sections of the electronic circuits 21 and/or 22 in accordance with a vertical (upward-and-downward) movement of the key top 12. Starting with the key top 12 as the top most portion, the switch mechanism 13 includes a first metal sheet 13*a*, a first elastic element 13*b*, a second metal sheet 13*c*, and a second elastic element 13*d*. The first metal sheet 13*a* and the second metal sheet 13*c* are connected to opposite ends of the first elastic element 13*b* respectively. The first metal sheet 13*a* is mounted under the key top 12. One end of the second elastic element 13*d* is connected to the second metal sheet 13*c*, and the other end of the second elastic element 13*d* is connected to an upper surface of the support plate 15*a*. When the key top 12 is pressed, the downward movement elastically deforms the first metal sheet 13*a*. The length of the first metal sheet 13*a* is longer than the distance between the two contact sections 21*a* of the first electronic circuit 21, the second metal sheet is elastic, and the length of the second metal sheet 13*c* is longer than the distance between the two contact sections 22*a* of the second electronic circuit 22, to ensure proper connectivity of first/second metal sheets 13*a*/13*c* with the electronic circuits 21/22 in use. In addition, the elasticity coefficient of the first elastic element 13*b* is greater than the elasticity coefficient of the second elastic element 13*d*. Accordingly, as the key top 12 is pressed, the deformation of the second elastic element 13*d* is greater than the deformation of the first elastic element 13*b*.

The first electronic circuit 21 is mounted over the second electronic circuit 22. Further, both the first electronic circuit 21 and the second circuit 22 are fixed on the body 15.

Figure 2:
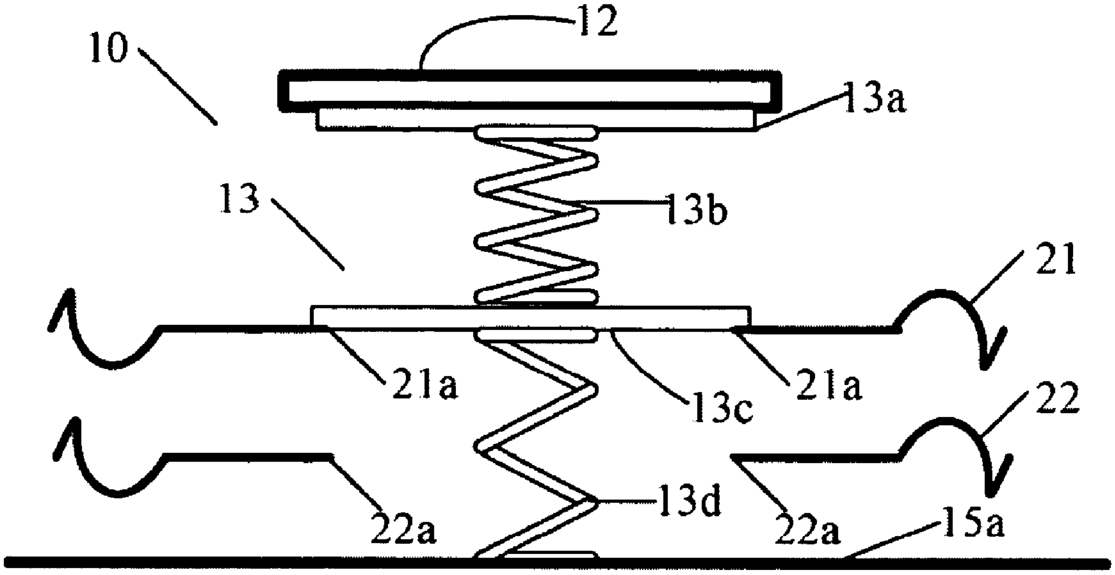
FIG. 2 is a schematic diagram illustrating the key switch of FIG. 1 in a first state when a second metal sheet of the switch mechanism is moved downwardly and contacts the first electronic circuit as the key top is pressed.

When the key top 12 is partially pressed, the first elastic element 13*b* and the second elastic element 13*d* are both deformed, accordingly, the first metal sheet 13*a* and the second metal sheet 13*c* are moved down. The second metal sheet 13*c* is moved down and contacts the contact sections 21*a*, the first electronic circuit 21 is closed, and the key switch 10 generates a first signal, see FIG. 2.

Figure 3:
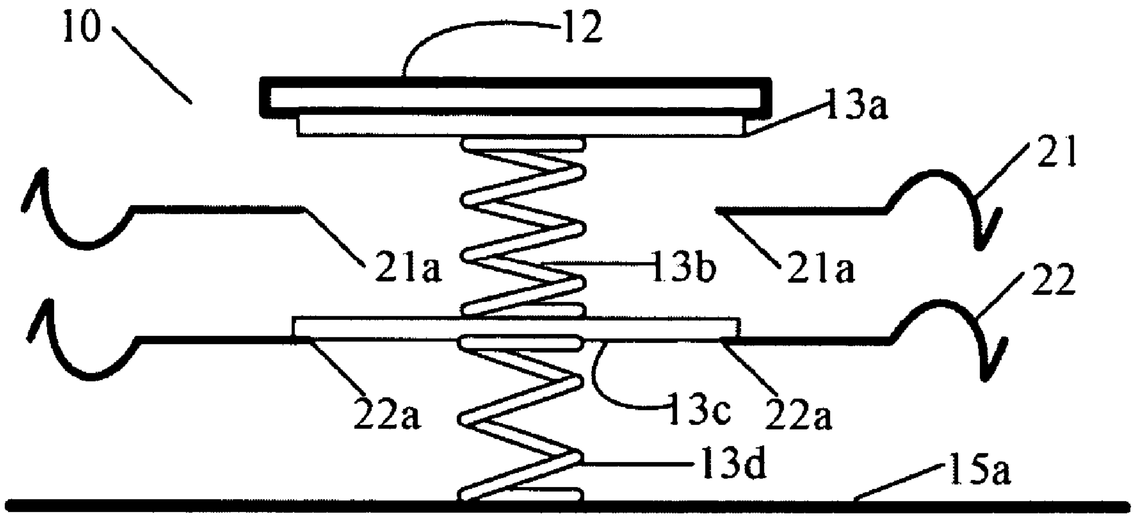
FIG. 3 is an illustration for explaining the key switch of FIG. 1 in a second state when a second metal sheet of the switch mechanism is moved downwardly and contacts the second electronic circuit as the key top is pressed further.

Referring to FIG. 3, as the key top 12 is pressed even further, the second metal sheet 13*c* is deformed and passes beyond the contact sections 21*a*, to contact the contact sections 22*a*, thus the second electronic circuit 22 is closed, and the key switch 10 generates a second signal.

Figure 4:
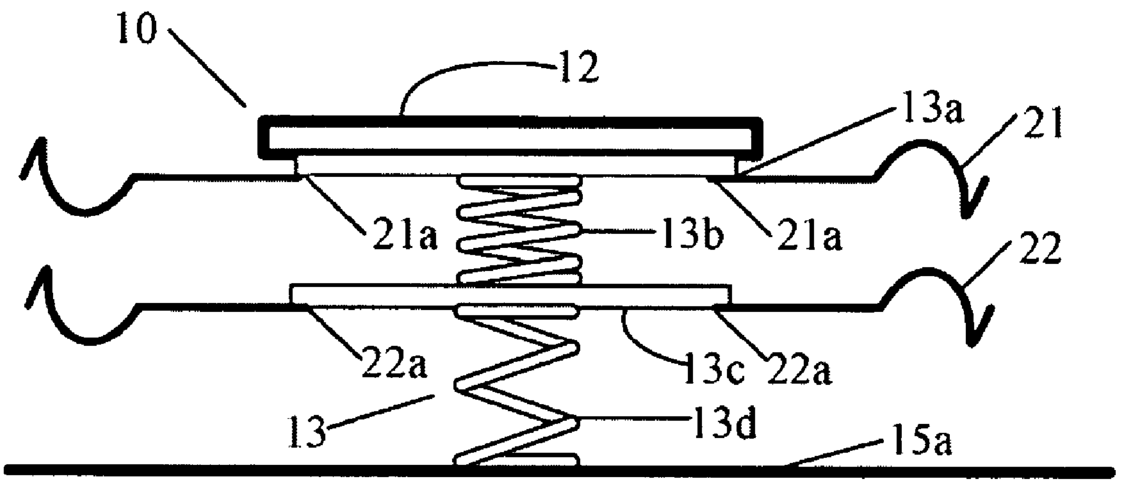
FIG. 4 is an illustration for explaining the key switch of FIG. 1 in a third state when the first metal sheet contacts the further electronic circuit and the first metal sheet contacts the first electronic circuit simultaneously.

Referring to FIG. 4, when the key top 12 is fully pressed, the first metal sheet 13*a* contacts the contact sections 21*a*, and at the same time, the second metal sheet 13*c* contacts the contact sections 22*a*, that is, both the first electronic circuit 21 and the second electronic circuit 22 are closed, and the key switch 10 generates a third signal. In addition, when the second metal sheet 13*c* contacts the contact sections 22*a*, the second metal sheet 13*c* is supported by the second electronic circuit 22*a*, accordingly, the second elastic element 13*d* is maintained in a current deformed state and will not be deformed further.

Figure 5:
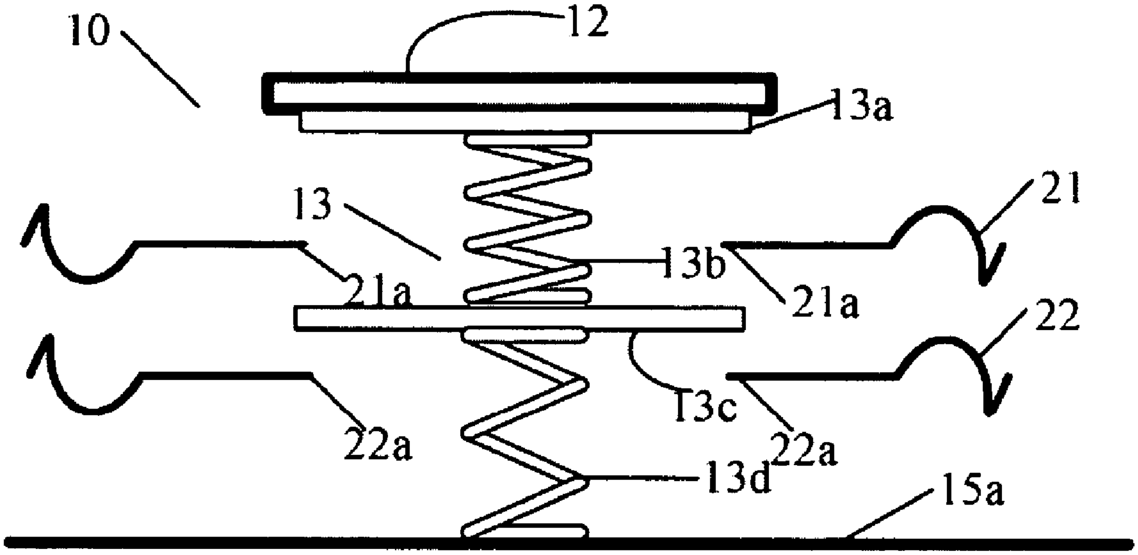
FIG. 5 is an illustration for explaining the key switch of FIG. 1 in a fourth state when both metal sheets do not contact the electronic circuits.

Referring to FIGS. 1 and 5, in this embodiment, when the contact sections 21*a* and 22*a* are not closed, namely, both the first electronic circuit 21 and the second electronic circuit 22 are not closed, no signal is generated by the key switch 10.

Figure 6:
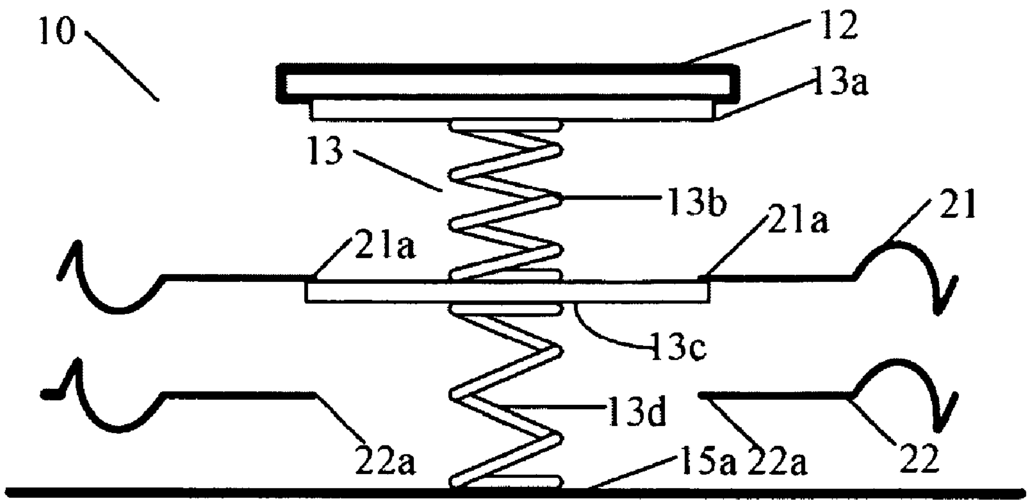
FIG. 6 is an illustration for explaining the key switch of FIG. 1 in a another state when the first metal sheet contacts the bottom of the first electronic circuit while the key switch is restored to the original position.

The upper surface of the second metal sheet 13*c* is covered with a resinous material, or other insulation. When the key top 12 is released, the first elastic element 13*b* and the second elastic element 13*d* rebound, and the key top 12 returns to the original position. During returning the key top 12 to the original position, while the second metal sheet 13*c* contacts the bottom of a pair of the first/second contact sections (see FIG. 6), the key switch 10 generates no signal because of insulation of the upper surface of the second metal sheet 13*c*.

For the purpose of easily understanding the exemplary embodiment, an exemplary process of generating three signals, for example, three numerals (e.g., 1, 2, 3) through the key switch 10 is described as follows. As the user presses the key top 12 slightly, the switch mechanism 13 moves downwardly, when the second metal sheet 13*c* contacts the contact sections 21*a*, the first electronic circuit 21 is closed, and the key switch 12 generates the first signal, e.g., numeral “1”. As the user presses the key top 12 even further, when the second metal sheet 13*c* contacts a the contact sections 22*a*, the second electronic circuit 22 is closed, and the key switch 10 generates the second signal, e.g., numeral “2”. As the user presses the key top 12 further more, when the first metal sheet 13*a* contacts the contact sections 21*a* and the second metal sheet 13*c* contacts the contact sections 22*a* synchronously, both the first electronic circuit 21 and the second electronic circuit 22 are closed, and the key switch 10 generates the third signal, e.g., numeral “3”. Therefore, three numerals (1, 2, 3) can be obtained through the key switch 10.

Although the present invention has been specifically described on the basis of the exemplary embodiment thereof, the invention is not to be construed as being limited thereto. Various changes or modifications may be made to the embodiment without departing from the scope and spirit of the invention.

What is claimed is:

1. A key switch comprising:

a key top;

a body having a support plate;

a first electronic circuit having two first contact sections;

a second electronic circuit having two second contact sections; and a switch mechanism mounted under the key top and supported by the body, for contacting an electronic circuits in accordance with a vertical (upward-and-downward) movement of the key top, wherein the switch mechanism comprises:

a first metal sheet;

a first elastic element;

a second metal sheet; and a second elastic element;

wherein the first metal sheet and the second metal sheet are connected to opposite ends of the first elastic element respectively, the first metal sheet is mounted under the key top, one end of the second elastic element is connected to the second metal sheet, and another end of the second elastic element is connected to an upper surface of the support plate;

wherein the switch key is configured to generate a first signal while the first electronic circuit is closed by the switch mechanism; the switch key is configured to generate a second signal while the second electronic circuit is closed; and the switch key is configured to generate a third signal while both the first electronic circuit and the second electronic circuit are closed.

2. The key switch as described in claim 1, wherein the key switch does not generate signals while both the first electronic circuit and the second electronic circuit are not closed by the switch mechanism.

3. The key switch as described in claim 1, wherein the key top is made of insulation material.

4. The key switch as described in claim 1, wherein the upper surface of the second metal sheet is covered with insulation.

5. The key switch as described in claim 1, wherein the first electronic circuit is mounted over the second electronic circuit, both the first electronic circuit and the second circuit are fixed on the body.

6. The key switch as described in claim 1, wherein the elasticity coefficient of the first elastic element is greater than the elasticity coefficient of the second elastic element.

* * * * *